(12) United States Patent
Toko et al.

(10) Patent No.: US 8,884,389 B2
(45) Date of Patent: Nov. 11, 2014

(54) MAGNETORESISTIVE ELEMENT AND METHOD OF MANUFACTURING THE SAME

(75) Inventors: Masaru Toko, Yokohama (JP); Masahiko Nakayama, Shimonoseki (JP); Akihiro Nitayama, Yokohama (JP); Tatsuya Kishi, Yokohama (JP); Hisanori Aikawa, Yokohama (JP); Hiroaki Yoda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 13/618,780

(22) Filed: Sep. 14, 2012

(65) Prior Publication Data

US 2013/0069186 A1 Mar. 21, 2013

(30) Foreign Application Priority Data

Sep. 20, 2011 (JP) ................. 2011-205323

(51) Int. Cl.
*H01L 27/22* (2006.01)
*H01L 21/8239* (2006.01)
*H01L 43/10* (2006.01)
*H01L 43/12* (2006.01)
*H01L 43/08* (2006.01)

(52) U.S. Cl.
CPC ............... *H01L 43/08* (2013.01); *H01L 43/10* (2013.01); *H01L 43/12* (2013.01); *H01L 27/228* (2013.01)
USPC ............................................. 257/425; 438/3

(58) Field of Classification Search
CPC ......... H01L 43/12; H01L 43/10; H01L 43/08; H01L 27/228
USPC .................... 257/E43.004, E27.005, E21.665
See application file for complete search history.

(56) References Cited

U.S. PATENT DOCUMENTS 6,165,803 A 12/2000 Chen et al.
6,297,983 B1 10/2001 Bhattacharyya
(Continued)

FOREIGN PATENT DOCUMENTS

JP 2000-156531 6/2000
JP 2001-308292 11/2001
(Continued)

OTHER PUBLICATIONS

U.S. Appl. No. 13/226,868, filed Sep. 7, 2011, Ohsawa et al.
(Continued)

*Primary Examiner* — Long K Tran
*Assistant Examiner* — Jordan Klein
(74) *Attorney, Agent, or Firm* — Knobbe Martens Olson & Bear LLP

(57) ABSTRACT

According to one embodiment, a magnetoresistive element comprises a first magnetic layer having a magnetization direction invariable and perpendicular to a film surface, a tunnel barrier layer formed on the first magnetic layer, and a second magnetic layer formed on the tunnel barrier layer and having a magnetization direction variable and perpendicular to the film surface. The first magnetic layer includes an interface layer formed on an upper side in contact with a lower portion of the tunnel barrier layer, and a main body layer formed on a lower side and serving as an origin of perpendicular magnetic anisotropy. The interface layer includes a first area provided on an inner side and having magnetization, and a second area provided on an outer side to surround the first area and having magnetization smaller than the magnetization of the first area or no magnetization.

15 Claims, 12 Drawing Sheets

(56) References Cited

U.S. PATENT DOCUMENTS

| | | |
|---|---|---|
| 6,365,286 B1 | 4/2002 | Inomata et al. |
| 6,391,430 B1 | 5/2002 | Fullerton et al. |
| 6,479,353 B2 | 11/2002 | Bhattacharyya |
| 6,713,830 B2 | 3/2004 | Nishimura et al. |
| 6,829,121 B2 | 12/2004 | Ikeda et al. |
| 6,987,652 B2 | 1/2006 | Koganei |
| 7,768,824 B2 | 8/2010 | Yoshikawa et al. |
| 7,957,184 B2 | 6/2011 | Yoshikawa et al. |
| 8,139,405 B2 | 3/2012 | Yoshikawa et al. |
| 8,154,915 B2 | 4/2012 | Yoshikawa et al. |
| 8,218,355 B2 | 7/2012 | Kitagawa et al. |
| 8,268,713 B2 | 9/2012 | Yamagishi et al. |
| 8,710,605 B2 | 4/2014 | Takahashi et al. |
| 2001/0022742 A1* | 9/2001 | Bhattacharyya ............ 365/171 |
| 2002/0146851 A1 | 10/2002 | Okazawa et al. |
| 2002/0167059 A1* | 11/2002 | Nishimura et al. .......... 257/421 |
| 2002/0182442 A1* | 12/2002 | Ikeda et al. ................. 428/692 |
| 2003/0067800 A1* | 4/2003 | Koganei ...................... 365/158 |
| 2004/0188732 A1* | 9/2004 | Fukuzumi .................... 257/295 |
| 2005/0274997 A1 | 12/2005 | Gaidis et al. |
| 2009/0080238 A1 | 3/2009 | Yoshikawa et al. |
| 2009/0243008 A1* | 10/2009 | Kitagawa et al. ............ 257/421 |
| 2010/0080050 A1* | 4/2010 | Ozeki et al. .................. 365/158 |
| 2010/0097846 A1 | 4/2010 | Sugiura et al. |
| 2010/0135068 A1 | 6/2010 | Ikarashi et al. |
| 2010/0230770 A1 | 9/2010 | Yoshikawa et al. |
| 2011/0037108 A1 | 2/2011 | Sugiura et al. |
| 2011/0059557 A1* | 3/2011 | Yamagishi et al. ............... 438/3 |
| 2011/0211389 A1 | 9/2011 | Yoshikawa et al. |
| 2011/0222335 A1 | 9/2011 | Yoshikawa et al. |
| 2013/0181305 A1 | 7/2013 | Nakayama et al. |

FOREIGN PATENT DOCUMENTS

| | | | |
|---|---|---|---|
| JP | 2002-280640 A | 9/2002 | |
| JP | 2002-299727 A | 10/2002 | |
| JP | 2002-305290 | 10/2002 | |
| JP | 2002299727 A | * 10/2002 | ............ H01L 43/08 |
| JP | 2003-110162 A | 4/2003 | |
| JP | 2003-536199 | 12/2003 | |
| JP | 2005-209951 A | 8/2005 | |
| JP | 2006-005342 | 1/2006 | |
| JP | 2007-053315 A | 3/2007 | |
| JP | 2008-153527 | 7/2008 | |
| JP | 2008-171882 | 7/2008 | |
| JP | 2008-193103 A | 8/2008 | |
| JP | 2009-081216 A | 4/2009 | |
| JP | 2009-239120 A | 10/2009 | |
| JP | 2011-040580 | 2/2011 | |
| JP | 2011-054873 | 3/2011 | |

OTHER PUBLICATIONS

U.S. Appl. No. 13/226,960, filed Sep. 7, 2011, Ohsawa et al.
U.S. Appl. No. 13/231,894, filed Sep. 13, 2011, Takahashi et al.
U.S. Appl. No. 13/604,537, filed Sep. 5, 2012, Nakayama et al.
First Office Action mailed on Sep. 11, 2012 by Japan Patent Office in the corresponding Japanese patent application No. 2010-210154.
Japanese Office Action dated Jan. 7, 2014 for Japanese Application No. 2011-205323.
Albert et al., "Spin-polarized current switching of a Co thin film nanomagnet," Applied Physics Letters, vol. 77, No. 23, pp. 3809-3811, Dec. 4, 2000.
Otani et al., "Microfabrication of Magnetic Tunnel Junctions Using $CH_3OH$ Etching," IEEE Transactions on Magnetics, vol. 43, No. 6, pp. 2776-2778, Jun. 2007.

* cited by examiner

Compound formation

Entry among lattice

Interatomic distance prolongation

Magnetic cluster separation

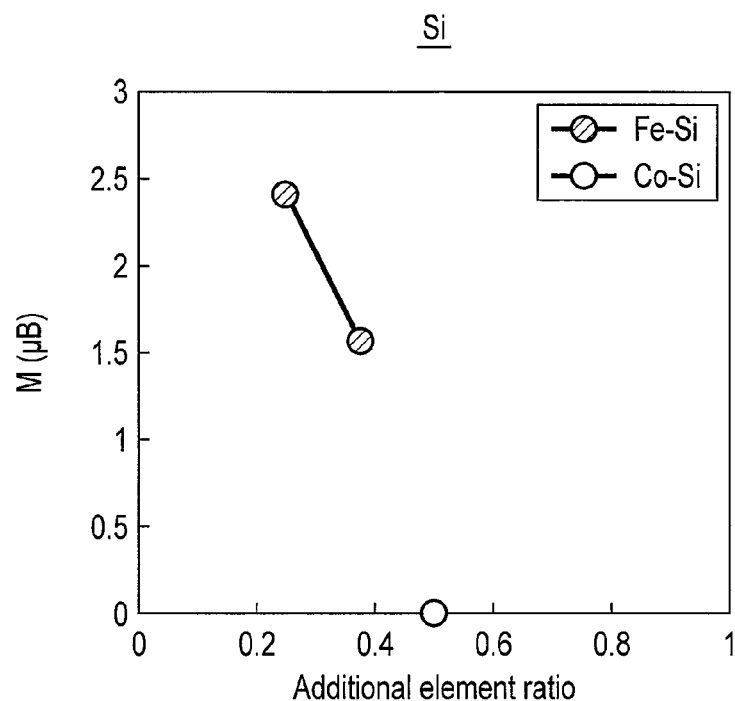
F I G. 8
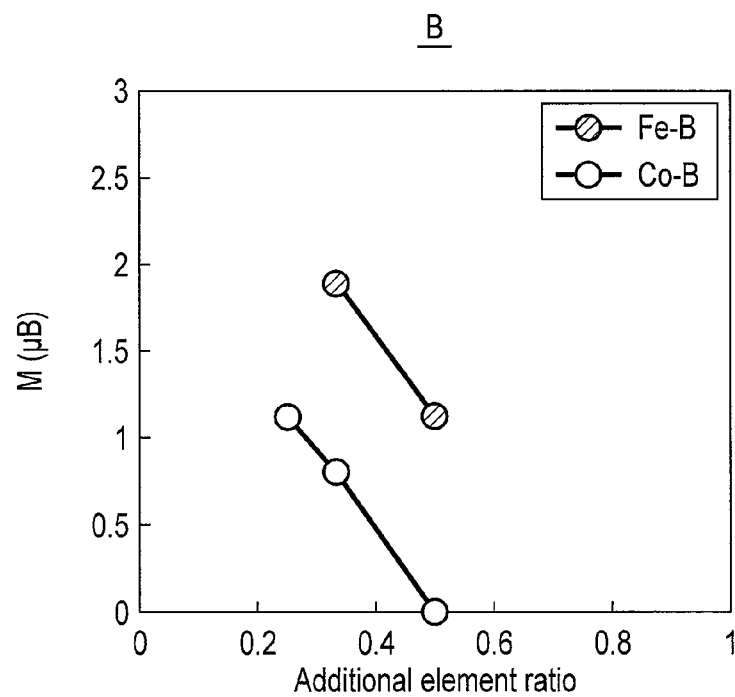
F I G. 9

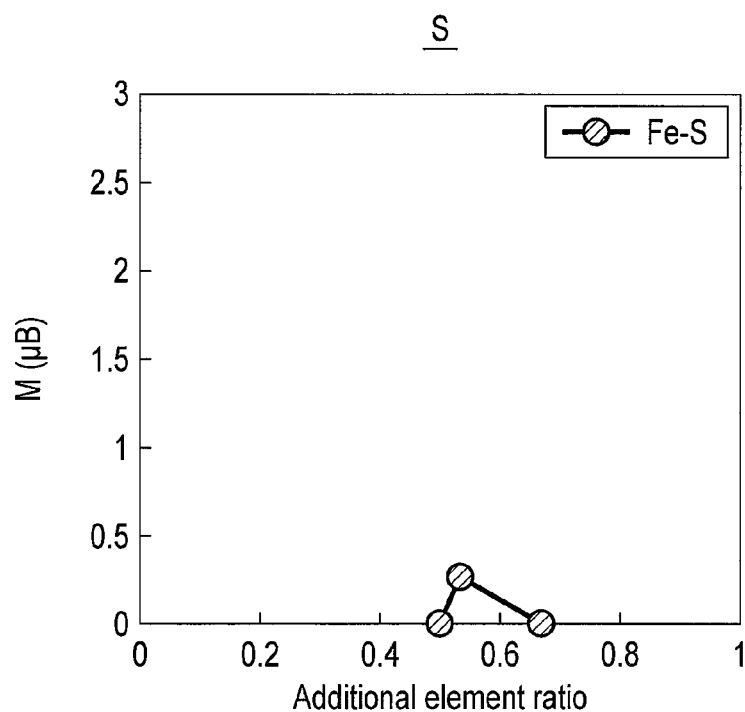
F I G. 10
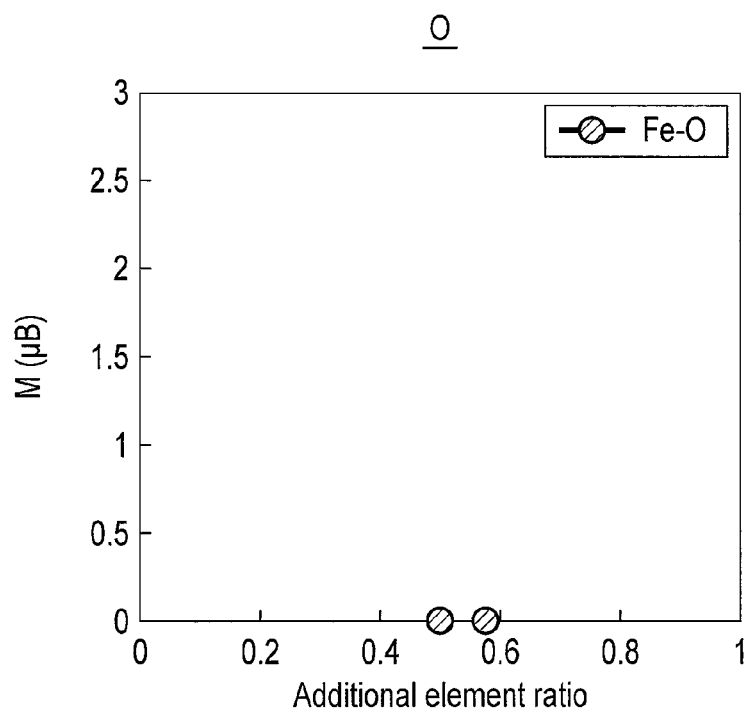
F I G. 11

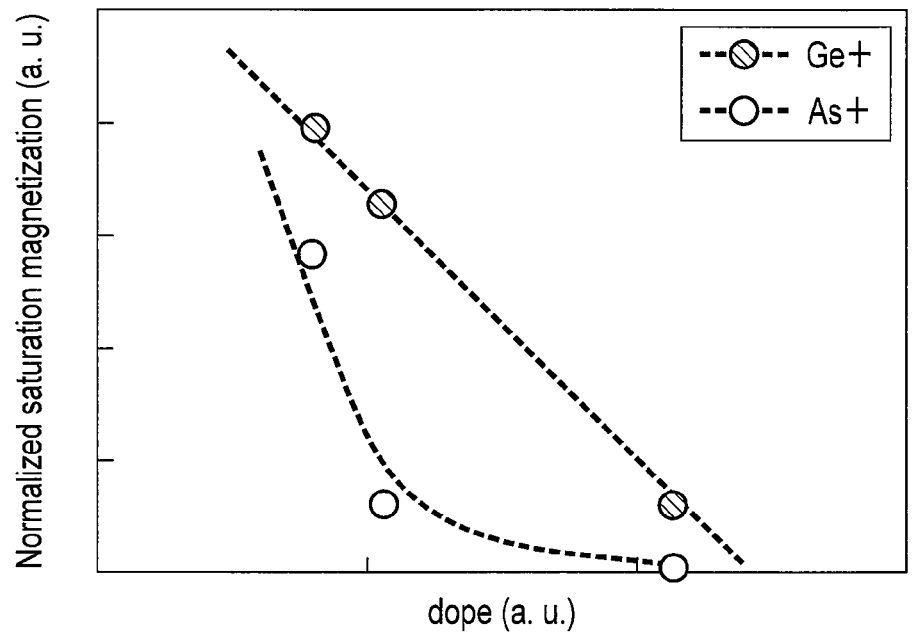
F I G. 1 2
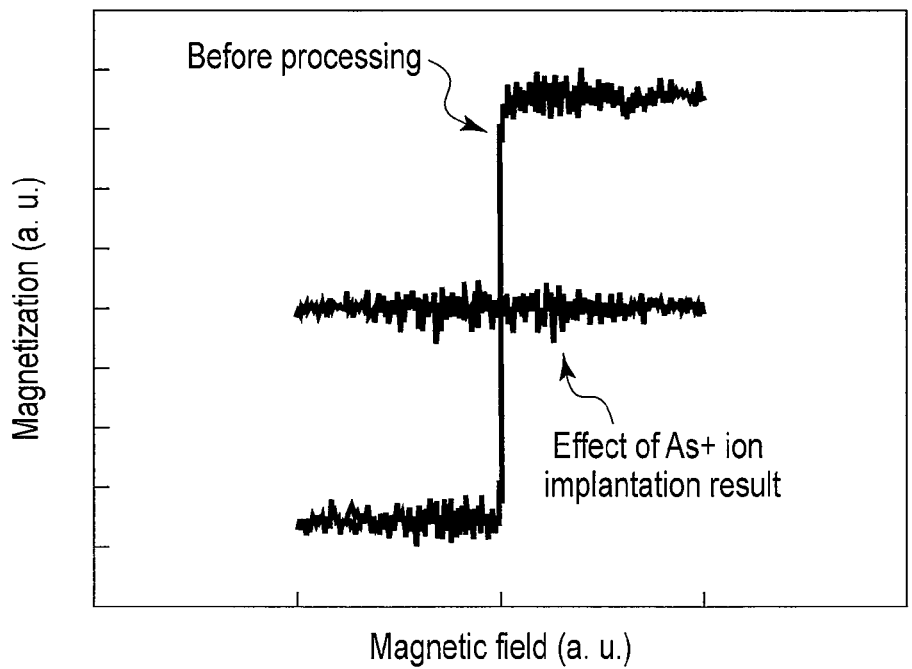
F I G. 1 3

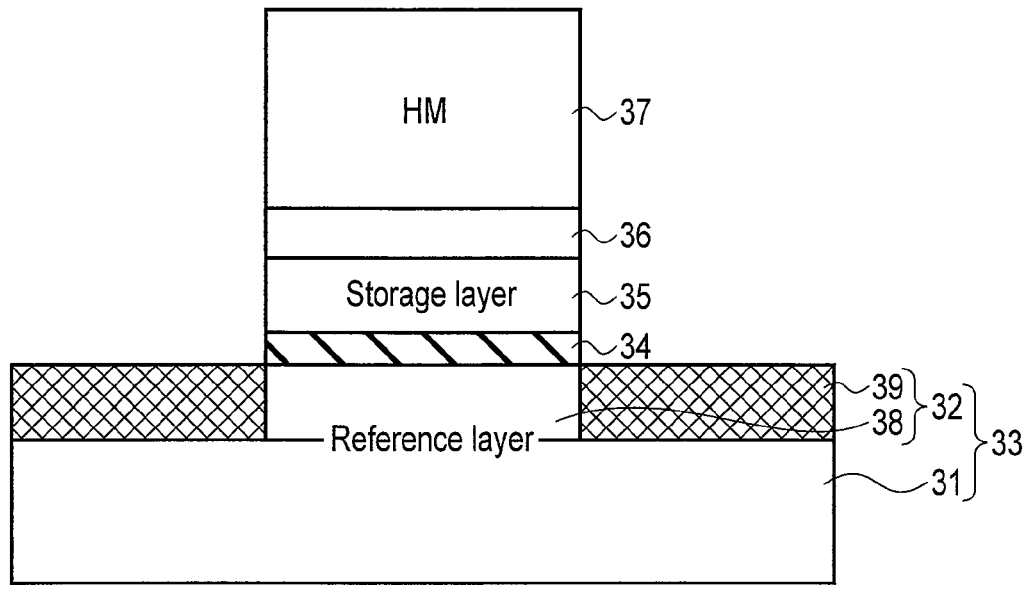
F I G. 14
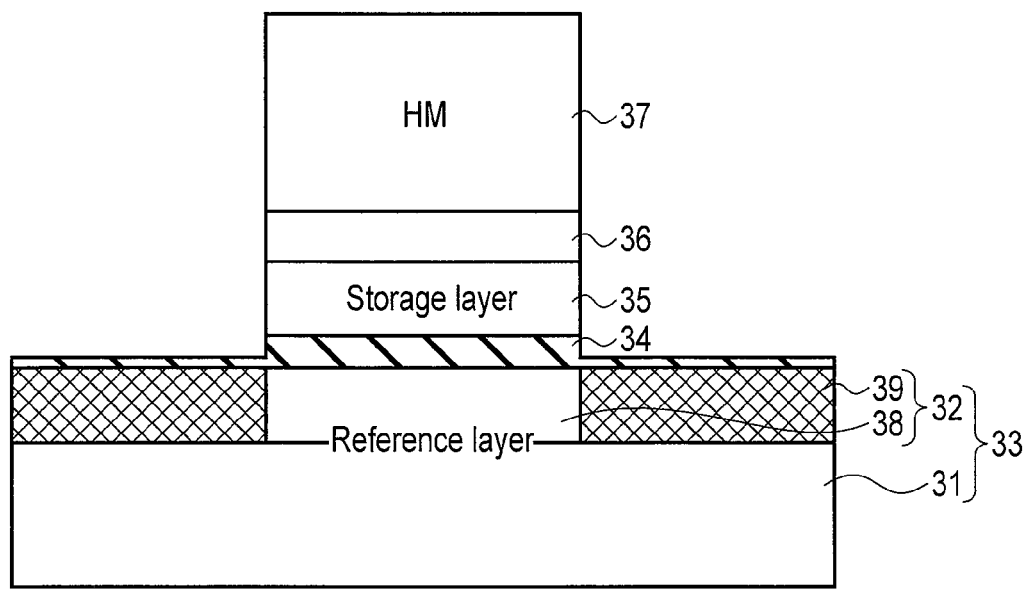
F I G. 15

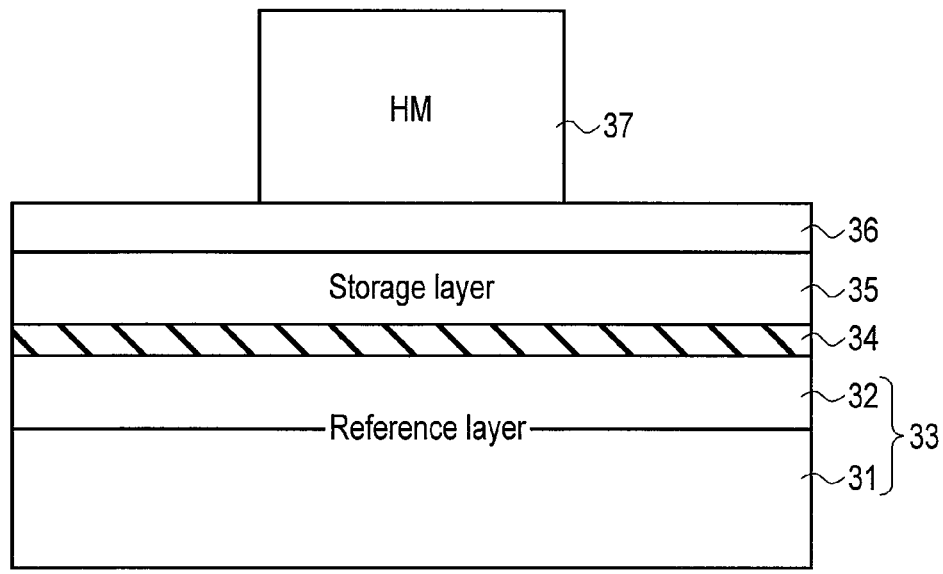
F I G. 16
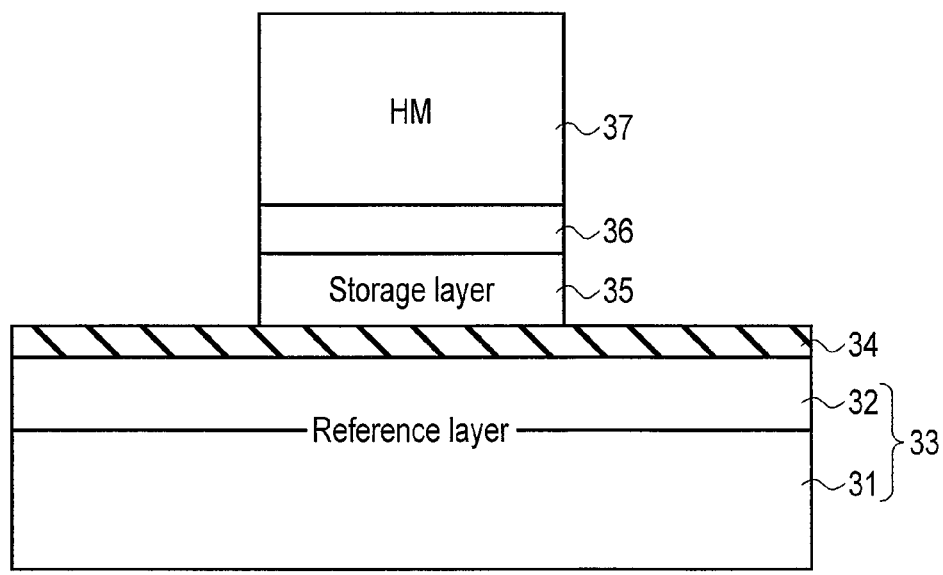
F I G. 17

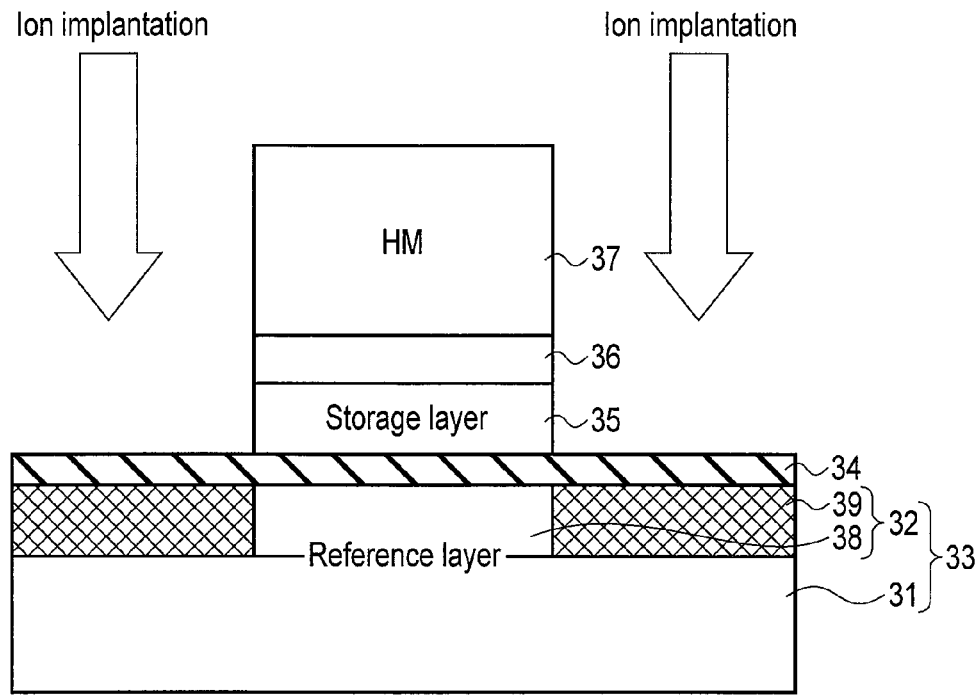
F I G. 1 8
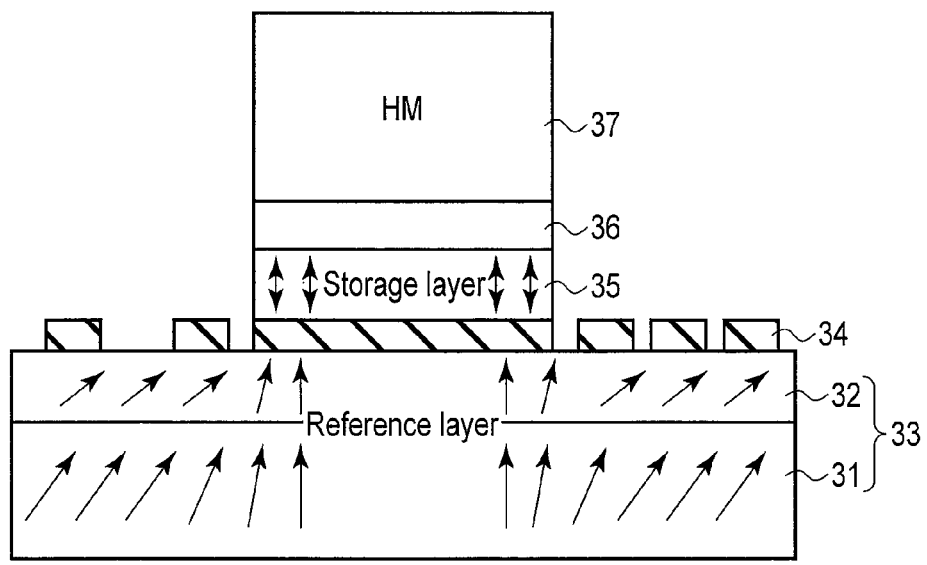
F I G. 1 9

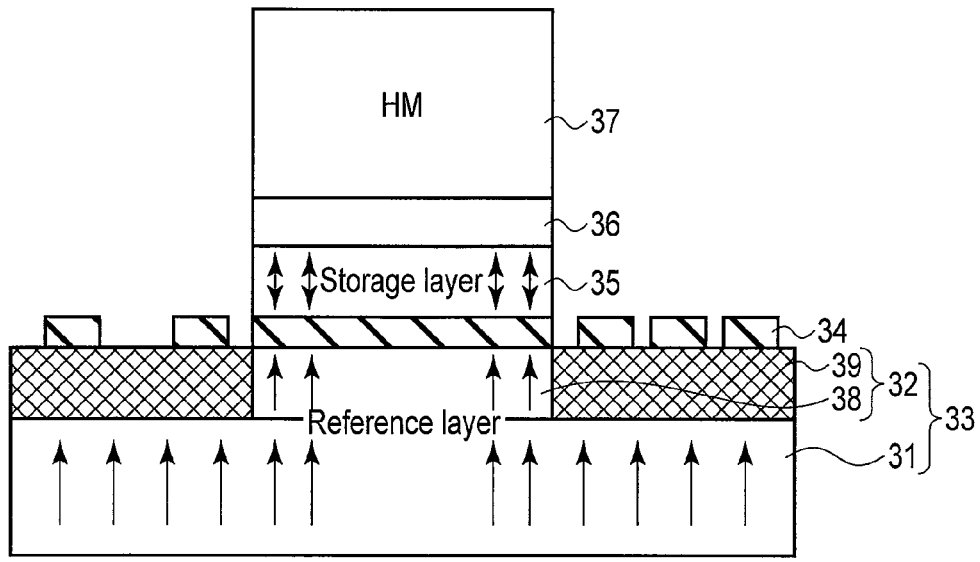
F I G. 2 0
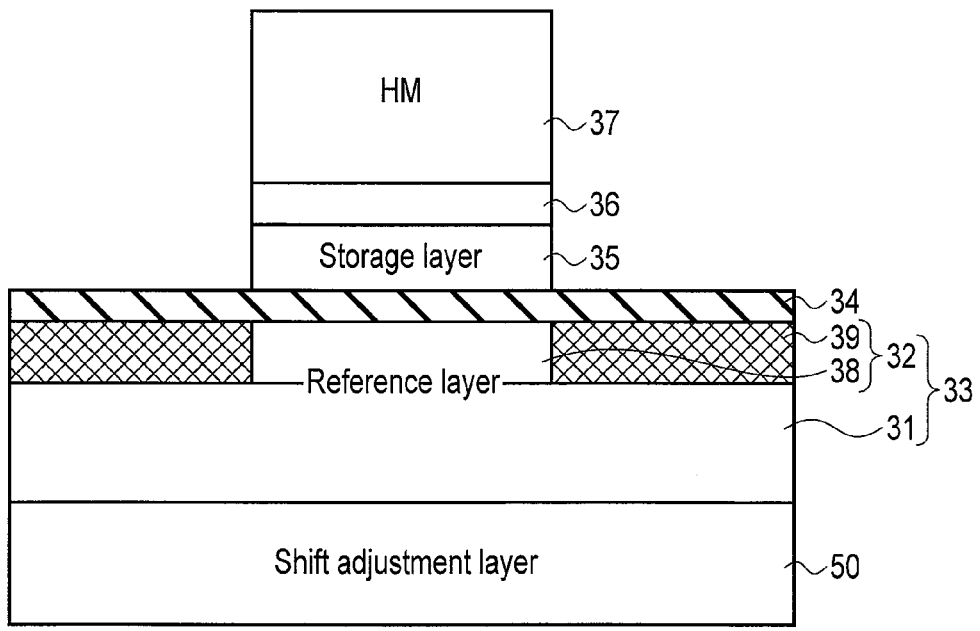
F I G. 2 1

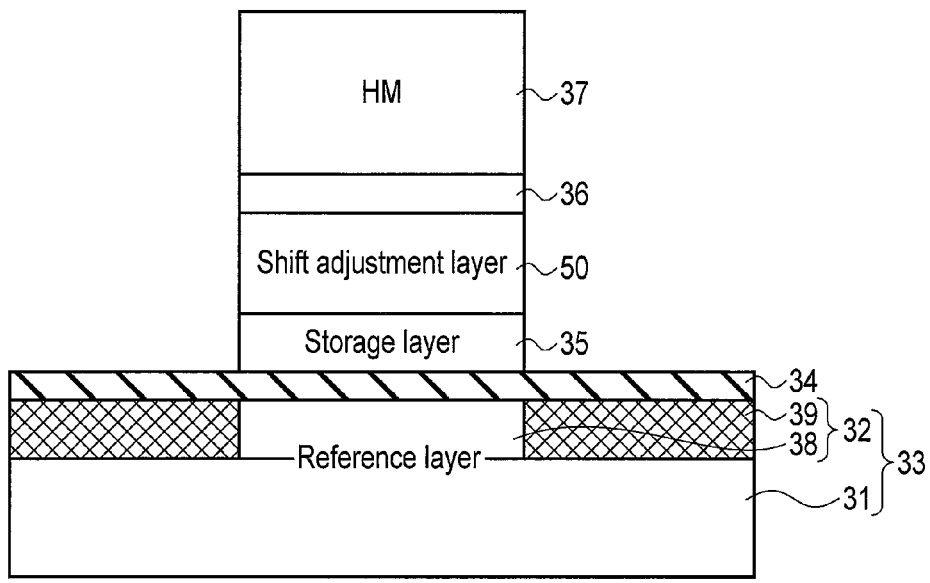
F I G. 22
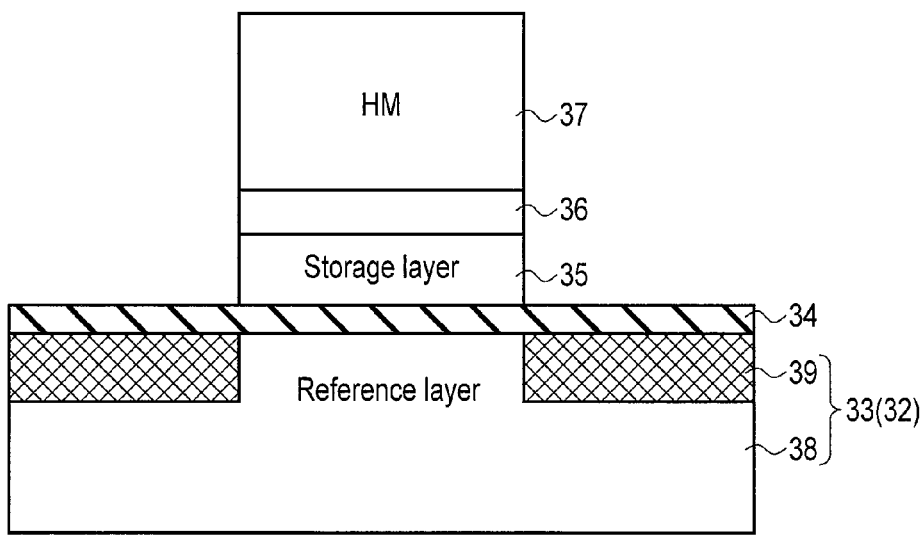
F I G. 23

MAGNETORESISTIVE ELEMENT AND METHOD OF MANUFACTURING THE SAME

CROSS-REFERENCE TO RELATED APPLICATIONS

This application is based upon and claims the benefit of priority from Japanese Patent Application No. 2011-205323, filed Sep. 20, 2011, the entire contents of which are incorporated herein by reference.

FIELD

Embodiments described herein relate generally to a magnetoresistive element and method of manufacturing the same.

BACKGROUND

An MRAM (Magnetic Random Access Memory) using a ferromagnetic material is expected as a nonvolatile memory endowed with nonvolatileness, high operation speed, large capacity, and low power consumption. The MRAM includes MTJ (Magnetic Tunnel Junction) elements using the TMR (Tunneling MagnetoResistive) effect as memory elements, and stores information based on the magnetization states of the MTJ elements. A perpendicular magnetization MTJ element has been proposed as an MTJ element, which stores information by generating magnetization perpendicular to the film surface.

The MTJ element includes a storage layer having a variable magnetization direction, and a reference layer having an invariable magnetization direction. The storage layer is stacked on a tunnel barrier layer on the reference layer. In the perpendicular magnetization MTJ element, the reference layer and the storage layer have different sizes. More specifically, the reference layer has, on the plane, a diameter larger than that of the storage layer located above. That is, the MTJ element has a step shape in the section. The reference layer includes an interface layer having a high polarization rate near the interface to the tunnel barrier layer to obtain a high magnetoresistive ratio necessary for reading information.

In general, perpendicular magnetic anisotropy is generated in the interface between the tunnel barrier layer and the interface layer. However, in the process of forming the above-described step structure, the tunnel barrier layer having an exposed surface is nonuniformly etched, and the crystal structure is distorted. Hence, the perpendicular magnetic anisotropy of the interface layer disappears, and the perpendicular magnetic anisotropy of the reference layer becomes unstable.

BRIEF DESCRIPTION OF THE DRAWINGS

FIG. 8 is a graph showing the relationship between magnetization and the additional element ratio of an Si element when the Si element is doped into the deactivated area according to the first embodiment;

FIG. 9 is a graph showing the relationship between magnetization and the additional element ratio of a B element when the B element is doped into the deactivated area according to the first embodiment;

FIG. 10 is a graph showing the relationship between magnetization and the additional element ratio of an S element when the S element is doped into the deactivated area according to the first embodiment;

FIG. 11 is a graph showing the relationship between magnetization and the additional element ratio of an O element when the O element is doped into the deactivated area according to the first embodiment;

FIG. 12 is a graph showing the relationship between the doping amount and magnetization when a group IV element and a group V element are doped into the deactivated area according to the first embodiment;

FIG. 13 is a graph showing the relationship between the magnetic field and magnetization when a group V element is doped into the deactivated area according to the first embodiment and a comparative example;

FIG. 14 is a sectional view showing the structure of a first modification of the magnetoresistive element MTJ according to the first embodiment;

FIG. 15 is a sectional view showing the structure of a second modification of the magnetoresistive element MTJ according to the first embodiment;

FIGS. 16, 17, and 18 are sectional views showing steps in the manufacture of the magnetoresistive element MTJ according to the first embodiment;

FIG. 19 is a sectional view showing a comparative example of the magnetization direction of the magnetoresistive element MTJ according to the first embodiment;

FIG. 20 is a sectional view showing the magnetization direction of the magnetoresistive element MTJ according to the first embodiment;

FIG. 21 is a sectional view showing the structure of a magnetoresistive element MTJ according to the second embodiment;

FIG. 22 is a sectional view showing the structure of a modification of the magnetoresistive element MTJ according to the second embodiment; and FIG. 23 is a sectional view showing the structure of a magnetoresistive element MTJ according to the third embodiment.

DETAILED DESCRIPTION

Figure 1:
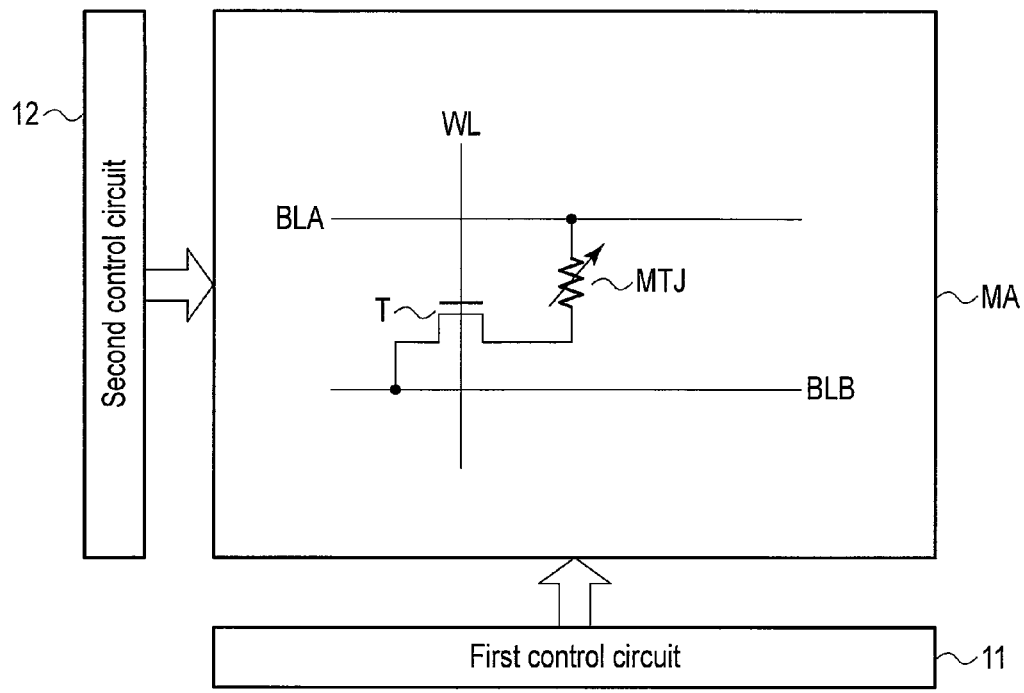
FIG. 1 is a circuit diagram showing a memory cell of an MRAM according to each embodiment.

In general, according to one embodiment, a magnetoresistive element comprises a first magnetic layer having a magnetization direction invariable and perpendicular to a film surface, a tunnel barrier layer formed on the first magnetic layer, and a second magnetic layer formed on the tunnel barrier layer and having a magnetization direction variable and perpendicular to the film surface. The first magnetic layer includes an interface layer formed on an upper side in contact with a lower portion of the tunnel barrier layer, and a main body layer formed on a lower side and serving as an origin of perpendicular magnetic anisotropy. The interface layer includes a first area provided on an inner side and having magnetization, and a second area provided on an outer side to surround the first area and having magnetization smaller than the magnetization of the first area or no magnetization.

The embodiments will now be described with reference to the accompanying drawings. The same reference numerals denote the same parts throughout the drawings, and a repetitive description thereof will be done as needed.

1. Example of Arrangement of MRAM

An example of the arrangement of an MRAM according to each embodiment will be described with reference to FIGS. 1 and 2.

FIG. 1 is a circuit diagram showing a memory cell of the MRAM according to each embodiment.

As shown in FIG. 1, a memory cell in a memory cell array MA includes a series connection structure of a magnetoresistive element MTJ and a switch element (for example, FET) T. One terminal of the series connection structure (one terminal of the magnetoresistive element MTJ) is connected to a bit line BLA, and the other terminal of the series connection structure (one terminal of the switch element T) is connected to a bit line BLB. The control terminal of the switch element T, for example, the gate electrode of the FET is connected to a word line WL.

The potential of the word line WL is controlled by a first control circuit 11. The potentials of the bit lines BLA and BLB are controlled by a second control circuit 12.

Figure 2:
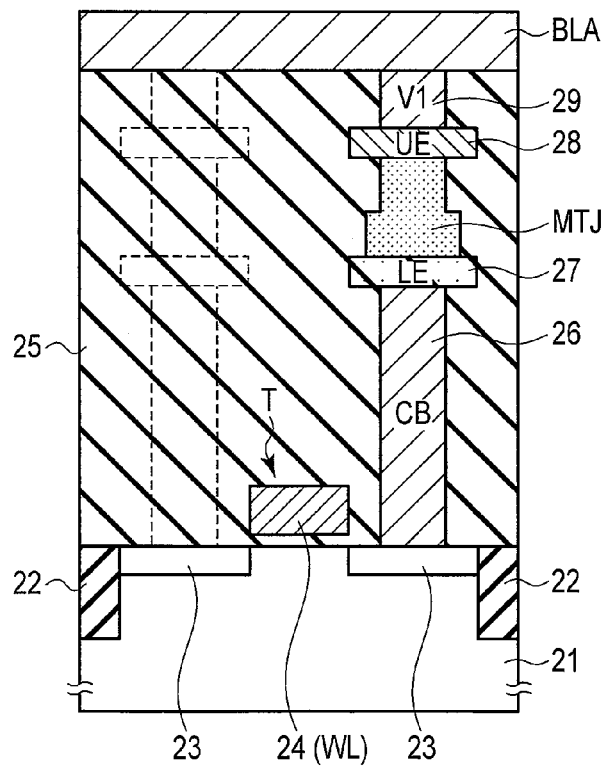
FIG. 2 is a sectional view showing the structure of the memory cell of the MRAM according to each embodiment.

FIG. 2 is a sectional view showing the structure of the memory cell of the MRAM according to each embodiment.

As shown in FIG. 2, the memory cell is formed from the switch element T and the magnetoresistive element MTJ arranged on a semiconductor substrate 21.

The semiconductor substrate 21 is, for example, a silicon substrate, and the conductivity type can be either P or N. In the semiconductor substrate 21, for example, a silicon oxide layer having an STI structure is arranged as an element isolation insulating layer 22.

The switch element T is arranged in the surface area of the semiconductor substrate 21, more specifically, in the element area (active area) surrounded by the element isolation insulating layer 22. In this example, the switch element T is an FET that includes two source/drain diffusion layers 23 in the semiconductor substrate 21, and a gate electrode 24 arranged on the channel area between them. The gate electrode 24 functions as the word line WL.

The switch element T is covered with an insulating layer (for example, silicon oxide) 25. Contact holes are formed in the insulating layer 25. A contact via (CB) 26 is arranged in each contact hole. The contact via 26 is made of a metal material such as W (tungsten) or Cu (copper).

The lower surface of the contact via 26 is connected to the switch element. In this example, the contact via 26 is in direct contact with the source/drain diffusion layer 23.

A lower electrode (LE) 27 is arranged on the contact via 26. The lower electrode 27 has a stacked structure of, for example, Ta (10 nm)/Ru (5 nm)/Ta (5 nm).

The magnetoresistive element MTJ is arranged on the lower electrode 27, that is, immediately above the contact via 26. Details of the magnetoresistive element MTJ according to this embodiment will be described later.

An upper electrode (UE) 28 is arranged on the magnetoresistive element MTJ. The upper electrode 28 is made of, for example, TiN. The upper electrode 28 is connected to the bit line (for example, Cu) BLA via a via (for example, Cu) 29.

2. First Embodiment

A magnetoresistive element MTJ according to the first embodiment will be described with reference to FIGS. 3, 4, 5, 6, 7, 8, 9, 10, 11, 12, 13, 14, 15, 16, 17, 18, 19, and 20. In the first embodiment, a reference layer interface layer 32 located under a tunnel barrier layer 34 in the magnetoresistive element MTJ includes a magnetized area (first area) 38 at the center portion, and a deactivated area (second area) 39 at the peripheral portion where the magnetization is smaller than that of the magnetized area 38. The magnetoresistive element MTJ according to the first embodiment will be explained below in detail.

2-1. Structure of First Embodiment

The structure of the magnetoresistive element MTJ according to the first embodiment will be described.

Figure 3A:
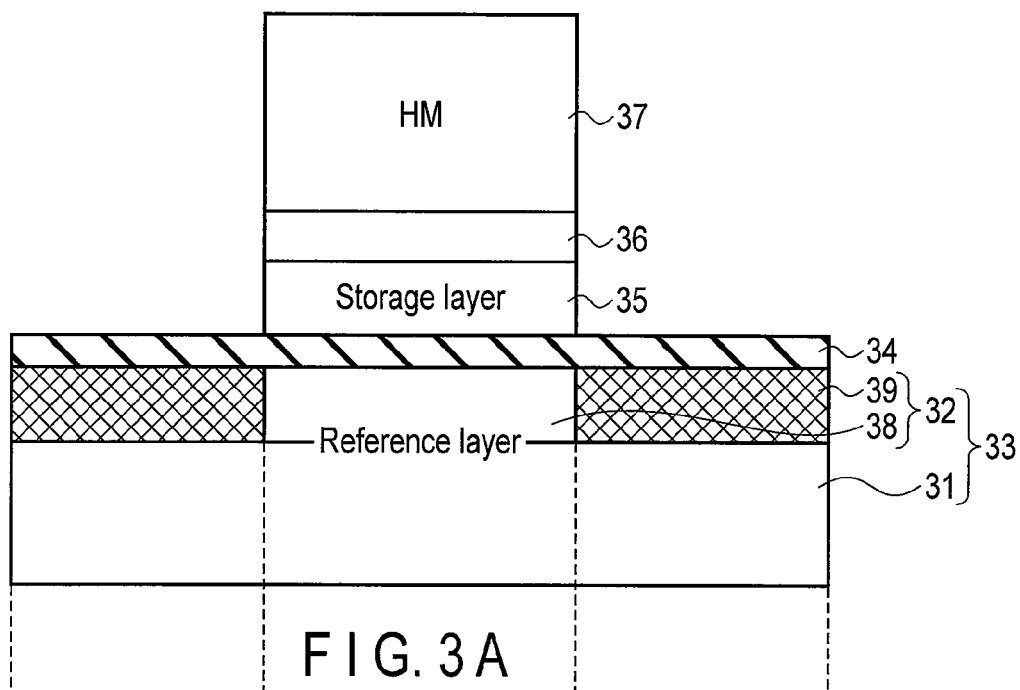
FIGS. 3A and 3B shows the structure of a magnetoresistive element MTJ according to the first embodiment.
Figure 3B:
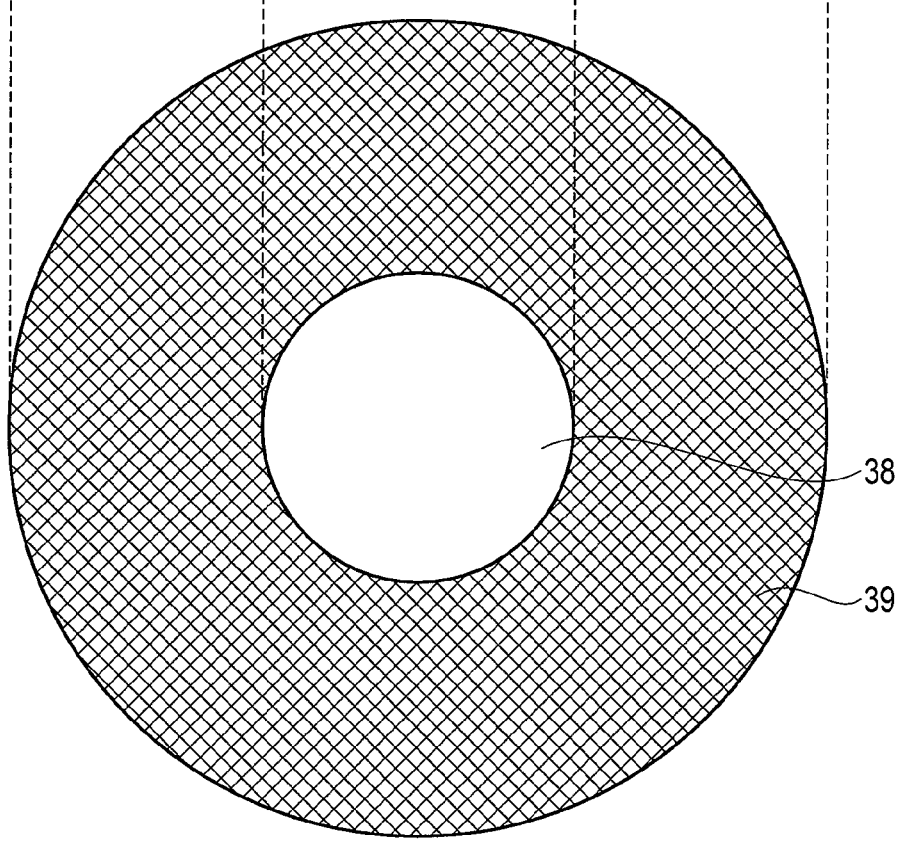

FIGS. 3A and 3B shows the structure of the magnetoresistive element MTJ according to the first embodiment. More specifically, FIG. 3A is a sectional view showing the structure of the magnetoresistive element MTJ, and FIG. 3B is a plan view showing the structure of the magnetoresistive element MTJ.

As shown in FIG. 3A, the magnetoresistive element MTJ includes a reference layer 33, a tunnel barrier layer 34, a storage layer 35, a cap layer 36, and a hard mask (HM) 37.

The reference layer 33 is formed on an underlying layer (not shown) on the lower electrode 27. The reference layer 33 is a magnetic layer having an invariable magnetization direction, and has perpendicular magnetization perpendicular or almost perpendicular to the film surface. "Invariable magnetization direction" means that the magnetization direction does not change for a predetermined write current.

The reference layer 33 is made of, for example, CoFeB. However, the embodiment is not limited to this. A ferromagnetic material containing at least one element selected from the group consisting of, for example, Co (cobalt), Fe (iron), B (boron) Ni (nickel), Ir (iridium), Pt (platinum), Mn (manganese), and Ru (ruthenium) may be used. Note that the reference layer 33 is made of CoFeB in the amorphous state at the time of formation, and is mainly made of CoFe after crystallization.

The reference layer 33 includes a reference layer main body layer 31 formed on the lower side, and a reference layer interface layer 32 formed on the upper side. That is, the reference layer main body layer 31 is formed on the underlying layer (not shown) on the lower electrode 27. The reference layer interface layer 32 is formed in contact with the lower portion of the tunnel barrier layer 34. The reference layer main body layer 31 is the origin of perpendicular magnetic anisotropy. The reference layer interface layer 32 attains lattice matching with respect to the tunnel barrier layer 34 in contact on the upper side. The reference layer main body layer 31 and the reference layer interface layer 32 are made of, for example, the same material (for example, CoFeB) but may have different composition ratios. More specifically, the composition ratio of the reference layer interface layer 32 is adjusted to attain lattice matching with respect to the tunnel barrier layer 34 in contact on the upper side. The reference layer main body layer 31 is not limited to CoFeB and may be made of a ferromagnetic material such as FePd, FePt, CoPd, or CoPt having the L10 structure or L11 structure, a ferrimagnetic material such as TbCoFe, or an artificial lattice formed from a stacked structure of a magnetic material such as Ni, Fe, or Co and a nonmagnetic material such as Cu (copper), Pd (palladium), or Pt. Details of the reference layer interface layer 32 according to the first embodiment will be described later.

"Perpendicular magnetization" means that the direction of residual magnetization is perpendicular or almost perpendicular to the film surface (upper surface/lower surface). In this specification, "almost perpendicular" means that the direction of residual magnetization falls within the range of 45°<θ≤90° with respect to the film surface.

The tunnel barrier layer 34 is formed on the reference layer 33. The tunnel barrier layer 34 is a nonmagnetic layer and is made of, for example, MgO. The tunnel barrier layer 34 comes into contact with the reference layer 33, thereby generating perpendicular magnetic anisotropy in the interface (reference layer interface layer 32) to the reference layer 33. Referring to FIG. 3, the tunnel barrier layer 34 is formed to a predetermined film thickness. In this embodiment, however, a case in which the tunnel barrier layer 34 is formed nonuniformly at the peripheral portion can be assumed.

The storage layer 35 is formed on the tunnel barrier layer 34. The storage layer 35 is a magnetic layer having a variable magnetization direction, and has perpendicular magnetization perpendicular or almost perpendicular to the film surface. "Variable magnetization direction" means that the magnetization direction changes for a predetermined write current. That is, the magnetization direction reversal threshold of the storage layer 35 is smaller than that of the reference layer 33.

The size of the storage layer 35 on the plane is smaller than that of the reference layer 33 and the tunnel barrier layer 34. The planar shape of the magnetoresistive element MTJ is, for example, circular. For this reason, the diameter of the storage layer 35 on the plane is smaller than that of the reference layer 33 and the tunnel barrier layer 34. The storage layer 35 is located above the central portion of the reference layer 33 and the tunnel barrier layer 34. Note that the planar shape of the magnetoresistive element MTJ need not always be circular and may be square, rectangular, elliptical, or the like.

The storage layer 35 uses a ferromagnetic material containing at least one element selected from the group consisting of, for example, Co and Fe. In addition, for the purpose of adjusting saturation magnetization, magnetocrystalline anisotropy, or the like, an element such as B (boron), C (carbon), or Si (silicon) may be doped into the ferromagnetic material.

The cap layer 36 is formed on the storage layer 35. The hard mask 37 is formed on the cap layer 36. The hard mask is made of a conductive material containing, for example, as a metal. An upper electrode 28 is formed on it.

The magnetoresistive element MTJ is, for example, a spin transfer torque magnetoresistive element. Hence, when writing data to the magnetoresistive element MTJ or reading data from the magnetoresistive element MTJ, a current is bidirectionally supplied to the magnetoresistive element MTJ in the direction perpendicular to the film surface (stacked surface).

More specifically, data write to the magnetoresistive element MTJ is performed in the following way.

When electrons (electrons moving from the reference layer 33 to the storage layer 35) are supplied from the side of a lower electrode 27, the electrons are spin-polarized in the same direction as the magnetization direction of the reference layer 33 and injected into the storage layer 35. In this case, the magnetization direction of the storage layer 35 is aligned to the same direction as the magnetization direction of the reference layer 33. The magnetization direction of the reference layer 33 and that of the storage layer 35 thus have parallel alignment. In this parallel alignment, the resistance value of the magnetoresistive element MTJ is minimized. This case will be defined as, for example, data "0".

On the other hand, when electrons (electrons moving from the storage layer 35 to the reference layer 33) are supplied from the side of the upper electrode 28, the electrons are reflected by the reference layer 33 to be spin-polarized in a direction reverse to the magnetization direction of the reference layer 33 and then injected into the storage layer 35. In this case, the magnetization direction of the storage layer 35 is aligned to the direction reverse to the magnetization direction of the reference layer 33. The magnetization direction of the reference layer 33 and that of the storage layer 35 thus have antiparallel alignment. In this antiparallel alignment, the resistance value of the magnetoresistive element MTJ is maximized. This case will be defined as, for example, data "1".

Data read is performed in the following way.

A read current is supplied to the magnetoresistive element MTJ. The read current is set to a value that does not reverse the magnetization direction of the storage layer 35 (a value smaller than the write current). The semiconductor device can perform the memory operation by detecting a change in the resistance value of the magnetoresistive element MTJ at this time.

In the first embodiment, the reference layer interface layer 32 includes a magnetized area 38, and a deactivated area 39 where the magnetization is smaller than that of the magnetized area 38. The magnetized area 38 has perpendicular magnetization in the same magnetization direction as in the reference layer main body layer 31. On the other hand, the deactivated area 39 has magnetization smaller than that of the magnetized area 38, or preferably has no magnetization.

As shown in FIG. 33, the magnetized area 38 is provided at the center (inner portion) of the reference layer interface layer 32, and the deactivated area 39 is provided at the peripheral portion (outer portion) to surround the magnetized area 38. More specifically, the magnetized area 38 is located under the storage layer 35 and overlaps the storage layer 35 when viewed from the upper side. In other words, the storage layer 35 does not exist above the deactivated area 39. That is, the diameter of the magnetized area 38 is the same as that of the storage layer 35. In addition, the inner diameter of the deactivated area 39 is the same as the diameter of the storage layer 35 (the diameter of the magnetized area 38). The outer diameter of the deactivated area 39 is the same as the diameter of the reference layer main body layer 31 and the tunnel barrier layer 34. However, the embodiment is not limited to this, and the inner diameter of the deactivated area 39 (the diameter of the magnetized area 38) may be larger than the diameter of the storage layer 35.

The deactivated area 39 contains an element (first element) contained in the magnetized area 38, and another element (second element) different from the element. That is, the deactivated area 39 is formed by using the first element, like the magnetized area 38, and then doping the second element. The deactivated area 39 contains the second element and thus has magnetization smaller than that of the magnetized area 38 or no magnetization at all. Note that the second element may be doped into the reference layer main body layer 31 as well to form the deactivated area 39 at part of the reference layer main body layer 31 adjacent to the reference layer interface layer 32.

Figure 4:
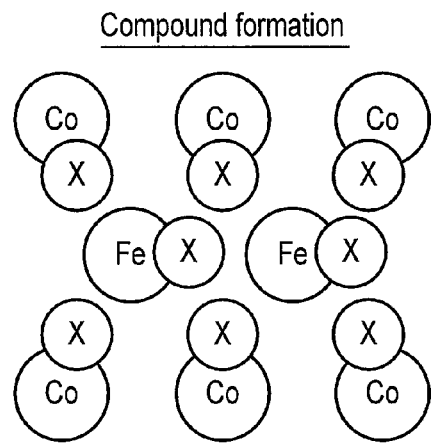
FIG. 4 is a view showing an example of the principle of magnetization disappearance of a deactivated area according to the first embodiment.

FIG. 4 is a view showing an example of the principle of magnetization disappearance of the deactivated area 39 according to the first embodiment. FIG. 5 is views showing other examples of the principle of magnetization disappearance of the deactivated area 39 according to the first embodiment.

As shown in FIG. 4, when the second element (X) is doped into the deactivated area 39, the second element makes chemical bonds with the first elements (for example, Co and Fe) to form a compound. A nonmagnetic (antiferromagnetic)

compound is thus formed, and the magnetization of the deactivated area 39 considerably decreases or disappears.

Figure 5A:
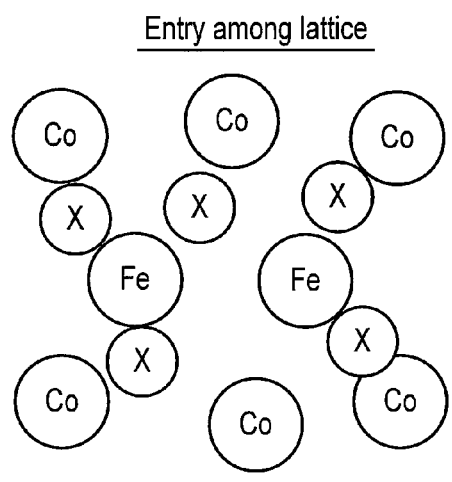
FIGS. 5A and 5B is views showing other examples of the principle of magnetization disappearance of the deactivated area according to the first embodiment.
Figure 5B:
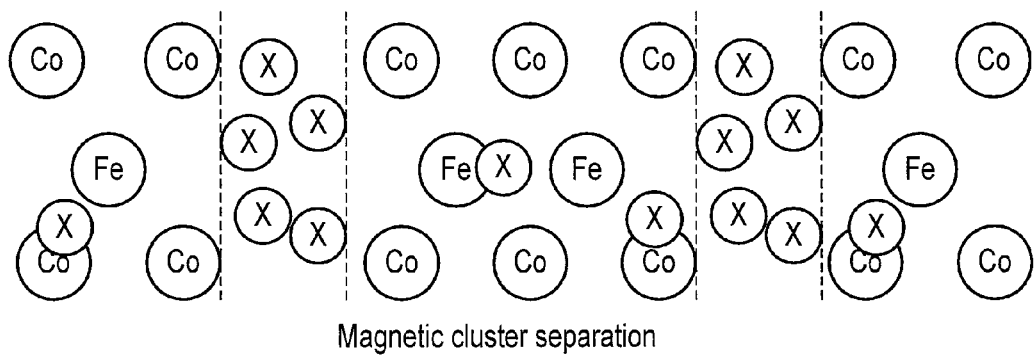

Alternatively, as shown in FIGS. 5A and 5B, when the second element is doped into the deactivated area 39, the second element enters among the first elements (among the lattice). The crystal structure of the first element changes, and the magnetization of the deactivated area 39 considerably decreases or disappears.

More specifically, the second element enters among the first elements (among Co and Fe) to prolong the Co—Fe interatomic distance, as shown in FIG. 5A. When the interatomic distance becomes long, the exchange interaction weakens, and the magnetization disappears.

Alternatively, the second element segregates to the grain boundary, and the first elements are separated into magnetic clusters each formed from a plurality of crystal grains, as shown in FIG. 5B. Superparamagnetism is generated in which the magnetizations of the magnetic clusters cancel each other, and the magnetization disappears.

Note that the compound formation shown in FIG. 4 has chemical stability higher than in the entry among the lattice shown in FIG. 5, and restoration of magnetization of the compound formation due to element diffusion or lattice rearrangement by an external cause such as heat occurs at low possibility. For this reason, an element that forms a compound with the first element is preferably used as the second element.

N (nitrogen), P (phosphorus), As (arsenic), or Sb (antimony) that is a pnictogen (group V) element, or C (carbon), Si (silicon), or Ge (germanium) that is a group IV element is used as the second element. The embodiment is not limited to those, and He (helium), F (fluorine), B (boron), Zr (zirconium), Tb (terbium), Ti (titanium), Mg (magnesium), S (sulfur), O (oxygen), or the like may also be used. Two or more of these elements may be used.

FIGS. 6, 7, 8, 9, 10, and 11 are graphs each showing the relationship between magnetization and the additional element ratio of an element when the element is doped into the deactivated area 39 according to the first embodiment. FIG. 12 is a graph showing the relationship between the doping amount and magnetization when a group IV element and a group V element are doped into the deactivated area 39 according to the first embodiment. FIG. 13 is a graph showing the relationship between the magnetic field and magnetization when a group V element is doped into the deactivated area 39 according to the first embodiment and a comparative example.

Figure 6:
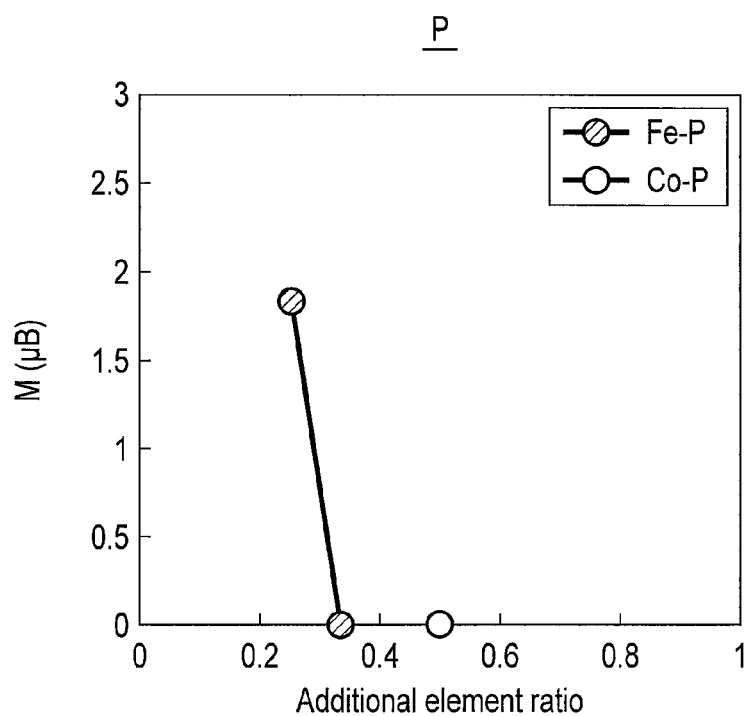
FIG. 6 is a graph showing the relationship between magnetization and the additional element ratio of a P element when the P element is doped into the deactivated area according to the first embodiment.
Figure 7:
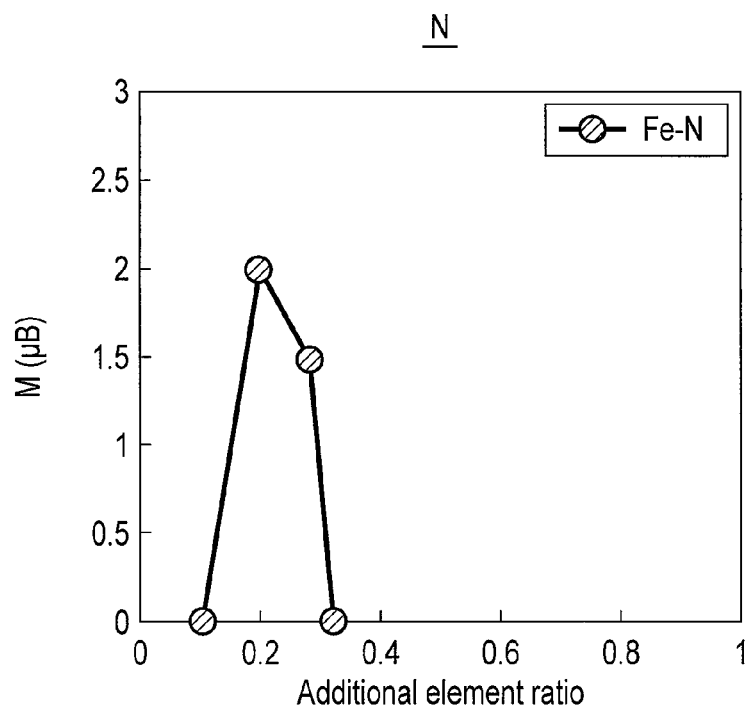
FIG. 7 is a graph showing the relationship between magnetization and the additional element ratio of an N element when the N element is doped into the deactivated area according to the first embodiment.

As shown in FIGS. 6 and 7, when a group V element (in this case, P or N) is doped into the deactivated area 39, the magnetization disappears at an additional element ratio of about 0.3. As shown in FIG. 8, when a group IV element (in this case, Si) is doped into the deactivated area 39, the magnetization disappears at an additional element ratio of about 0.5.

On the other hand, as shown in FIGS. 9, 10, and 11, when an element (in this case, B, S, or O) other than the groups IV and V is doped into the deactivated area 39, the magnetization disappears at an additional element ratio of 0.5 or more.

As described above, when a group V element or a group IV element is doped into the deactivated area 39, the magnetization can disappear with a smaller amount of element, as compared to the other elements.

As shown in FIG. 12, when a group V element (in this case, As) is doped into the deactivated area 39, the magnetization can disappear with a smaller doping amount as compared to a case in which a group IV element (in this case, Ge) is doped. As shown in FIG. 13, when a group V element (in this case, As) is doped into the deactivated area 39, the magnetization generated by applying a magnetic field considerably decreases as compared to a case in which no element is doped.

As described above, to make the magnetization of the deactivated area 39 disappear, the deactivated area 39 is most preferably doped with a group V element.

2-2. Structures of Modifications of First Embodiment

The structures of modifications of the magnetoresistive element MTJ according to the first embodiment will be described.

FIG. 14 is a sectional view showing the structure of a first modification of the magnetoresistive element MTJ according to the first embodiment. FIG. 15 is a sectional view showing the structure of a second modification of the magnetoresistive element MTJ according to the first embodiment.

As shown in FIG. 14, in the first modification of the first embodiment, the tunnel barrier layer 34 is not formed on the deactivated area 39. In other words, the tunnel barrier layer 34 is formed only on the magnetized area 38 (center) of the reference layer interface layer 32. That is, the diameter of the tunnel barrier layer 34 is the same as that of the magnetized area 38 and the storage layer 35. This is because the peripheral portion of the tunnel barrier layer 34 is removed together with the storage layer 35 in an etching process to be described later.

As shown in FIG. 15, in the second modification of the first embodiment, the tunnel barrier layer 34 is formed to be thinner on the deactivated area 39 than on the magnetized area 38. In other words, the tunnel barrier layer 34 is formed to be thinner at the peripheral portion than at the center. This is because the peripheral portion of the tunnel barrier layer 34 is partially removed together with the storage layer 35 in an etching process to be described later.

2-3. Manufacturing Method of First Embodiment

A method of manufacturing the magnetoresistive element MTJ according to the first embodiment will be described.

FIGS. 16, 17, and 18 are sectional views showing steps in the manufacture of the magnetoresistive element MTJ according to the first embodiment.

First, as shown in FIG. 16, a reference layer main body layer 31 is formed on an underlying layer (not shown) on a lower electrode 27. The reference layer main body layer 31 is made of, for example, a ferromagnetic material such as CoFeB, FePd, FePt, CoPd, or CoPt having the L10 structure or L11 structure, a ferrimagnetic material such as TbCoFe, or an artificial lattice formed from a stacked structure of a magnetic material such as Ni, Fe, or Co and a nonmagnetic material such as Cu, Pd, or Pt. The reference layer main body layer 31 is a magnetic layer having an invariable magnetization direction, and has perpendicular magnetization perpendicular or almost perpendicular to the film surface.

Next, a reference layer interface layer 32 is formed on the reference layer main body layer 31. The reference layer interface layer 32 is made of, for example, CoFeB, like the reference layer main body layer 31, but may have a different composition ratio. The reference layer interface layer 32 is a magnetic layer having an invariable magnetization direction, and has perpendicular magnetization perpendicular or almost perpendicular to the film surface, like the reference layer main body layer 31.

A tunnel barrier layer 34 is formed on the reference layer interface layer 32. The tunnel barrier layer 34 is made of, for example, MgO and is a nonmagnetic layer.

A storage layer 35 is formed on the tunnel barrier layer 34. The storage layer 35 is a magnetic layer having a variable magnetization direction, and has perpendicular magnetization perpendicular or almost perpendicular to the film surface.

After that, a cap layer 36 is formed on the storage layer 35. A hard mask 37 is formed on the cap layer 36. The hard mask 37 is made of a conductive material containing, for example, a metal. However, the embodiment is not limited to this, and the hard mask 37 may be made of an insulating material. After that, a resist pattern is formed on the hard mask 37. The hard mask 37 is patterned by, for example, IBE (Ion Beam Etching) or RIE (Reactive Ion Etching) using the resist pattern as a mask. The hard mask 37 thus remains at the center, and the upper surface of the cap layer 36 is exposed at the peripheral portion.

As shown in FIG. 17, the cap layer 36 and the storage layer 35 are patterned by, for example, IBE or RIE using the patterned hard mask 37 as a mask. The cap layer 36 and the storage layer 35 remain at the center, and the upper surface of the tunnel barrier layer 34 is exposed at the peripheral portion.

Note that at this time, the tunnel barrier layer 34 may be patterned or partially patterned at the peripheral portion, as shown in FIG. 14 or 15. That is, the upper surface of the reference layer interface layer 32 may be exposed at the peripheral portion. Since IBE reduces damage to the etching surface (side surface) of the storage layer 35, this patterning process is preferably performed by IBE.

As shown in FIG. 18, an impurity is ion-implanted to the exposed surface (upper surface). More specifically, an impurity is ion-implanted from the upper surface of the tunnel barrier layer 34 exposed at the peripheral portion, and the impurity element is doped into the peripheral portion of the reference layer interface layer 32. When the tunnel barrier layer 34 is also patterned, the impurity may be ion-implanted directly to the exposed upper surface of the reference layer interface layer 32. With this process, a magnetized area 38 is formed at the center of the reference layer interface layer 32, and a deactivated area 39 having small magnetization (or no magnetization) is formed at the peripheral portion.

At this time, the ion implantation is performed perpendicularly to the upper surface of the tunnel barrier layer 34. However, the embodiment is not limited to this, and the angle may slightly be shifted depending on the manufacturing apparatus. More specifically, any angle that prohibits a large amount of the impurity element from being implanted directly from the side surface of the storage layer 35 is usable.

The impurity element (second element) ion-implanted into the deactivated area 39 is different from the element (first element) contained in the reference layer interface layer 32 (magnetized area 38). N, P, As, or Sb that is a group V element, or C, Si, or Ge that is a group IV element is used as the second element. The embodiment is not limited to those, and He, F, B, Zr, Tb, Ti, Mg, S, O, or the like may also be used. Two or more of these elements may be used.

A side wall spacer layer (not shown) is formed on the side surfaces of the storage layer 35, the cap layer 36, and the hard mask 37. The tunnel barrier layer 34 and a reference layer 33 are patterned by, for example, IBE or RIE using the side wall spacer layer as a mask. That is, the peripheral portion of the tunnel barrier layer 34 and the peripheral portion of the reference layer 33 (the peripheral portions of the deactivated area 39 and the reference layer main body layer 31) are etched.

After that, a protective layer (not shown) is formed on the entire surface, and the magnetoresistive element MTJ according to the first embodiment is completed.

2-4. Effect of First Embodiment

According to the first embodiment, in the magnetoresistive element MTJ including the storage layer 35 and the reference layer 33 having a larger diameter, the reference layer interface layer 32 is formed from the magnetized area 38 at the center (inner portion) and the deactivated area 39 at the peripheral portion (outer portion) having magnetization smaller than that of the magnetized area 38. With this arrangement, even if the peripheral portion (outer portion) of the tunnel barrier layer 34 located between the storage layer 35 and the reference layer interface layer 32 is nonuniformly etched in the patterning process of the storage layer 35, the magnetization direction of the deactivated area 39 located immediately below is not distorted. It is therefore possible to suppress degradation of the magnetic characteristic of the reference layer 33. This effect will be described in more detail.

FIG. 19 is a sectional view showing a comparative example of the magnetization direction of the magnetoresistive element MTJ according to the first embodiment. FIG. 20 is a sectional view showing the magnetization direction of the magnetoresistive element MTJ according to the first embodiment.

A case will be examined, in which the peripheral portion, (exposed peripheral portion) of the tunnel barrier layer 34 is nonuniformly etched in the patterning process of the storage layer 35, and crystal defects occur, as shown in FIGS. 19 and 20.

According to the comparative example, the deactivated area 39 is not formed at the peripheral portion of the reference layer interface layer 32, as shown in FIG. 19. Normally, interface magnetic anisotropy (perpendicular magnetic anisotropy) is generated in the reference layer interface layer 32 that is in contact with the tunnel barrier layer 34. However, if the peripheral portion of the tunnel barrier layer 34 is nonuniformly etched, the perpendicular magnetic anisotropy at the peripheral portion of the reference layer interface layer 32 located immediately below the tunnel barrier layer 34 disappears. As a result, the magnetization direction at the peripheral portion of the reference layer interface layer 32 becomes unstable, and the magnetization direction of the reference layer main body layer 31 also becomes unstable.

On the other hand, according to the first embodiment, the deactivated area 39 without magnetization is formed at the peripheral portion of the reference layer interface layer 32, as shown in FIG. 20. For this reason, even if the peripheral portion of the tunnel barrier layer 34 is nonuniformly etched, the magnetization direction at the peripheral portion (deactivated area 39) of the reference layer interface layer 32 located immediately below the tunnel barrier layer 34 never becomes unstable. That is, since no magnetization exists in the deactivated area 39 inherently, the magnetization direction of the deactivated area 39 does not become unstable due to the nonuniformity of tunnel barrier layer 34. As a result, the magnetization direction of the reference layer main body layer 31 does not become unstable, either.

Note that when the deactivated area 39 has small magnetization, and the peripheral portion of the tunnel barrier layer 34 is nonuniformly etched, the magnetization direction of the deactivated area 39 becomes unstable. However, since the magnetization of the deactivated area 39 is small, the influence on the reference layer main body layer 31 is small and substantially negligible.

The perpendicular magnetic anisotropy with respect to the reference layer interface layer 32 disappears not only when the peripheral portion of the tunnel barrier layer 34 is nonuniformly etched but also when the peripheral portion of the tunnel barrier layer 34 is completely removed. That is, the first embodiment is applicable independently of the presence/absence of the peripheral portion of the tunnel barrier layer 34, and is applicable in various cases in which, for example, the peripheral portion is nonuniformly formed or completely etched.

3. Second Embodiment

A magnetoresistive element MTJ according to the second embodiment will be described with reference to FIGS. 21 and 22. In the second embodiment, a shift adjustment layer 50 that is a magnetic layer having an invariable magnetization direction reverse to the magnetization direction of a reference layer 33 is formed in the magnetoresistive element MTJ. The magnetoresistive element MTJ according to the second embodiment will be explained below in detail. Note that in the second embodiment, a description of the same points as in the first embodiment will be omitted, and different points will mainly be explained.

3-1. Structure of Second Embodiment

The structure of the magnetoresistive element MTJ according to the second embodiment will be described.

FIG. 21 is a sectional view showing the structure of the magnetoresistive element MTJ according to the second embodiment.

As shown in FIG. 21, the second embodiment is different from the first embodiment in that the magnetoresistive element MTJ includes the shift adjustment layer 50.

The shift adjustment layer 50 is formed on an underlying layer (not shown) on a lower electrode 27. The shift adjustment layer 50 is a magnetic layer having an invariable magnetization direction, and has perpendicular magnetization perpendicular or almost perpendicular to the film surface. The magnetization direction is reverse to that of a reference layer 33. Hence, the shift adjustment layer 50 can cancel a leakage magnetic field from the reference layer 33 to the storage layer 35. In other words, the shift adjustment layer 50 has the effect of adjusting the offset of the reversing characteristic for the storage layer 35, which is caused by the leakage magnetic field from the reference layer 33, to the reverse direction. The shift adjustment layer 50 is made of, for example, a ferromagnetic material such as FePd, FePt, CoPd, or CoPt having the L10 structure or L11 structure or an artificial lattice formed from a stacked structure of a magnetic material such as Ni, Fe, or Co and a nonmagnetic material such as Cu, Pd, or Pt.

The reference layer 33 is formed on a spacer layer (not shown) on the shift adjustment layer 50. The diameter of the shift adjustment layer 50 is the same as that of the reference layer 33 (the outer diameter of a deactivated area 39) and is larger than the diameter of the storage layer 35 (the inner diameter of the deactivated area 39 or the diameter of a magnetized area 38).

3-2. Structure of Modification of Second Embodiment

The structure of a modification of the magnetoresistive element MTJ according to the second embodiment will be described.

FIG. 22 is a sectional view showing the structure of a modification of the magnetoresistive element MTJ according to the second embodiment.

As shown in FIG. 22, in the modification of the second embodiment, the shift adjustment layer 50 is formed on the storage layer 35. A cap layer 36 is formed on the shift adjustment layer 50. The diameter of the shift adjustment layer 50 is the same as that of the storage layer 35 (the inner diameter of the deactivated area 39 or the diameter of the magnetized area 38) and is smaller than the diameter of the reference layer 33 (the outer diameter of the deactivated area 39).

3-3. Manufacturing Method of Second Embodiment

A method of manufacturing the magnetoresistive element MTJ according to the second embodiment will be described.

First, as shown in FIG. 21, a shift adjustment layer 50 is formed on an underlying layer (not shown) on a lower electrode 27. The shift adjustment layer 50 is made of, for example, a ferromagnetic material such as FePd, FePt, CoPd, or CoPt having the L10 structure or L11 structure or an artificial lattice formed from a stacked structure of a magnetic material such as Ni, Fe, or Co and a nonmagnetic material such as Cu, Pd, or Pt.

Next, a reference layer main body layer 31, a reference layer interface layer 32, a tunnel barrier layer 34, a storage layer 35, a cap layer 36, and a hard mask 37 are sequentially stacked on the shift adjustment layer 50. The hard mask 37, the cap layer 36, and the storage layer 35 are patterned. After that, an impurity element is doped into the peripheral portion of the reference layer interface layer 32.

A side wall spacer layer (not shown) is formed on the side surfaces of the storage layer 35, the cap layer 36, and the hard mask 37. The tunnel barrier layer 34, a reference layer 33, and the shift adjustment layer 50 are patterned by, for example, IBE or RIE using the side wall spacer layer as a mask. That is, the peripheral portion of the tunnel barrier layer 34, the peripheral portion of the reference layer 33 (the peripheral portions of a deactivated area 39 and the reference layer main body layer 31), and the peripheral portion of the shift adjustment layer 50 are etched.

After that, a protective layer (not shown) is formed on the entire surface, and the magnetoresistive element MTJ according to the second embodiment is completed.

3-4. Manufacturing Method of Modification of Second Embodiment

A method of manufacturing the modification of the magnetoresistive element MTJ according to the second embodiment will be described.

First, as shown in FIG. 22, a reference layer main body layer 31, a reference layer interface layer 32, a tunnel barrier layer 34, and a storage layer 35 are sequentially stacked on an underlying layer (not shown) on a lower electrode 27.

Next, a shift adjustment layer 50 is formed on the storage layer 35. The shift adjustment layer 50 is made of, for example, a ferromagnetic material such as FePd, FePt, CoPd, or CoPt having the L10 structure or L11 structure or an artificial lattice formed from a stacked structure of a magnetic material such as Ni, Fe, or Co and a nonmagnetic material such as Cu, Pd, or Pt.

A cap layer 36 and a hard mask 37 are sequentially stacked on the shift adjustment layer 50. The hard mask 37, the cap layer 36, the shift adjustment layer 50, and the storage layer 35 are patterned by, for example, IBE or RIE. After that, an impurity element is doped into the peripheral portion of the reference layer interface layer 32.

A side wall spacer layer (not shown) is formed on the side surfaces of the storage layer 35, the shift adjustment layer 50, the cap layer 36, and the hard mask 37. The tunnel barrier layer 34 and a reference layer 33 are patterned by, for example, IBE or RIE using the side wall spacer layer as a mask. That is, the peripheral portion of the tunnel barrier layer 34 and the peripheral portion of the reference layer 33 (the peripheral portions of a deactivated area 39 and the reference layer main body layer 31) are etched.

After that, a protective layer (not shown) is formed on the entire surface, and the modification of the magnetoresistive element MTJ according to the second embodiment is completed.

3-5. Effect of Second Embodiment

According to the second embodiment, the same effect as in the first embodiment can be obtained.

Additionally, in the second element, the shift adjustment layer 50 having magnetization in a direction reverse to that of the reference layer 33 is formed under the reference layer 33 or on the storage layer 35 in the magnetoresistive element MTJ. This allows to cancel the leakage magnetic field from the reference layer 33 to the storage layer 35 and improve the magnetic characteristic of the magnetoresistive element MTJ.

4. Third Embodiment

A magnetoresistive element MTJ according to the third embodiment will be described with reference to FIG. 23. In the third embodiment, a reference layer 33 has not a stacked structure of a reference layer interface layer 32 and a reference layer main body layer 31 but an integrated structure thereof. The magnetoresistive element MTJ according to the third embodiment will be explained below in detail. Note that in the third embodiment, a description of the same points as in the first embodiment will be omitted, and different points will mainly be explained.

4-1. Structure of Third Embodiment

The structure of the magnetoresistive element MTJ according to the third embodiment will be described.

FIG. 23 is a sectional view showing the structure of the magnetoresistive element MTJ according to the third embodiment.

As shown in FIG. 23, the third embodiment is different from the first embodiment in that the reference layer main body layer 31 is not formed.

The reference layer 33 includes only the reference layer interface layer 32 formed on an underlying layer (not shown). The reference layer interface layer 32 is made of, for example, CoFeB. At this time, the reference layer interface layer 32 has perpendicular magnetic anisotropy generated in the interface to a tunnel barrier layer 34 formed on it and also has the function of the reference layer main body layer 31.

The reference layer 33 (reference layer interface layer 32) includes a magnetized area 38, and a deactivated area 39 where the magnetization is smaller than that of the magnetized area 38. The magnetized area 38 has perpendicular magnetization in an invariable magnetization direction. On the other hand, the deactivated area 39 has magnetization smaller than that of the magnetized area 38, or preferably has no magnetization.

In the reference layer interface layer 32, the magnetized area 38 is formed at the center on the upper side (the side of the tunnel barrier layer 34) and throughout the lower portion. On the other hand, the deactivated area 39 is formed at the peripheral portion on the upper side. That is, the deactivated area 39 surrounds the magnetized area 38 located at the center on the upper side.

Note that the deactivated area 39 may be formed at the peripheral portion on the lower side. That is, the deactivated area 39 may be formed throughout the peripheral portion.

The deactivated area 39 contains an element (first element) contained in the magnetized area 38, and another element (second element) different from the element. That is, the deactivated area 39 is formed by using the first element, like the magnetized area 38, and then doping the second element. The deactivated area 39 contains the second element and thus has magnetization smaller than that of the magnetized area 38 or no magnetization at all.

4-2. Manufacturing Method of Third Embodiment

A method of manufacturing the magnetoresistive element MTJ according to the third embodiment will be described.

First, as shown in FIG. 23, a reference layer interface layer 32 is formed on an underlying layer (not shown) on a lower electrode 27. The reference layer interface layer 32 is made of, for example, CoFeB. The reference layer interface layer 32 has perpendicular magnetic anisotropy generated in the interface to a tunnel barrier layer 34 formed on it.

The tunnel barrier layer 34, a storage layer 35, a cap layer 36, and a hard mask 37 are sequentially stacked on the reference layer interface layer 32. The hard mask 37, the cap layer 36, and the storage layer 35 are patterned by, for example, IBE or RIE.

Next, an impurity element is doped into the peripheral portion on the upper side of the reference layer interface layer 32 to form a deactivated area 39.

A side wall spacer layer (not shown) is formed on the side surfaces of the storage layer 35, the cap layer 36, and the hard mask 37. The tunnel barrier layer 34 and a reference layer 33 are patterned by, for example, IBE or RIE using the side wall spacer layer as a mask. That is, the peripheral portion of the tunnel barrier layer 34 and the peripheral portion of the reference layer 33 (the peripheral portions of a deactivated area 39 and the reference layer interface layer 32) are etched.

After that, a protective layer (not shown) is formed on the entire surface, and the magnetoresistive element MTJ according to the third embodiment is completed.

4-3. Effect of Third Embodiment

According to the third embodiment, the same effect as in the first embodiment can be obtained.

Additionally, in the third element, the reference layer main body layer 31 is not formed as the reference layer 33. Normally, the reference layer main body layer 31 can be made of not only CoFeB but also an alloy such as CoPt, a ferrimagnetic material such as TbCoFe, or a stacked artificial lattice system such as Co/Pt. That is, the manufacturing process of the reference layer main body layer 31 is more difficult than that of the reference layer interface layer 32. In the third embodiment, however, the reference layer 33 is formed from only the reference layer interface layer 32, and the reference layer main body layer 31 whose manufacturing process is difficult need not be formed. For this reason, only the reference layer interface layer 32 made of CoFeB easy to deposit needs to be formed in the manufacturing process. Consequently, the manufacturing process of the reference layer 33 becomes easy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
   a first magnetic layer having a magnetization direction invariable and perpendicular to a film surface;
   a tunnel barrier layer formed on the first magnetic layer; and
   a second magnetic layer formed on the tunnel barrier layer and having a magnetization direction variable and perpendicular to the film surface,
   wherein the first magnetic layer includes an interface layer formed on an upper side in contact with a lower portion of the tunnel barrier layer, and a main body layer formed on a lower side and serving as an origin of perpendicular magnetic anisotropy, and
   the interface layer includes a first area provided on an inner side and having magnetization, and a second area provided on an outer side to surround the first area and having magnetization smaller than the magnetization of the first area or no magnetization,
   wherein a film thickness of the tunnel barrier layer on the second area is smaller than a film thickness of the tunnel barrier layer on the first area.

2. The element of claim 1, wherein the second area contains a first element contained in the first area and a second element different from the first element, thereby making the magnetization smaller than the magnetization of the first area.

3. The element of claim 2, wherein the second element includes one of a group V element and a group IV element.

4. The element of claim 2, wherein the second element includes at least one of N, P, As, Sb, C, Si, Ge, He, F, B, Zr, Tb, Ti, Mg, S, and O.

5. The element of claim 2, wherein the second area has the magnetization smaller than the magnetization of the first area as the second element makes a chemical bond with the first element to form a compound, or the second element enters among a lattice formed by the first element to change a crystal structure.

6. The element of claim 1, wherein a diameter of the first magnetic layer is larger than a diameter of the second magnetic layer, and a diameter of the first area is equal to the diameter of the second magnetic layer.

7. The element of claim 1, wherein the second magnetic layer does not exist on the second area.

8. The element of claim 1, further comprising a third magnetic layer that is provided under the first magnetic layer or on the second magnetic layer, has a magnetization direction invariable and reverse to the magnetization direction of the first magnetic layer, and cancels a leakage magnetic field from the first magnetic layer to the second magnetic layer.

9. The element of claim 1, wherein the tunnel barrier layer does not exist on the second area.

10. A magnetoresistive element comprising:
    a first magnetic layer having a magnetization direction invariable and perpendicular to a film surface;
    a tunnel barrier layer formed on the first magnetic layer; and
    a second magnetic layer formed on the tunnel barrier layer and having a magnetization direction variable and perpendicular to the film surface,
    wherein the first magnetic layer includes a first area provided on an inner side on an upper side and having magnetization, and a second area provided on an outer side to surround the first area and having magnetization smaller than the magnetization of the first area or no magnetization,
    wherein a film thickness of the tunnel barrier layer on the second area is smaller than a film thickness of the tunnel barrier layer on the first area.

11. The element of claim 10, wherein the second area contains a first element contained in the first area and a second element different from the first element, thereby making the magnetization smaller than the magnetization of the first area.

12. The element of claim 11, wherein the second element includes one of a group V element and a group IV element.

13. The element of claim 11, wherein the second element includes at least one of N, P, As, Sb, C, Si, Ge, He, F, B, Zr, Tb, Ti, Mg, S, and O.

14. The element of claim 11, wherein the second area has the magnetization smaller than the magnetization of the first area as the second element makes a chemical bond with the first element to form a compound, or the second element enters among a lattice formed by the first element to change a crystal structure.

15. The element of claim 10, wherein a diameter of the first magnetic layer is larger than a diameter of the second magnetic layer, and a diameter of the first area is equal to the diameter of the second magnetic layer.

* * * * *